(12) United States Patent
Deng et al.

(10) Patent No.: US 11,502,688 B2
(45) Date of Patent: Nov. 15, 2022

(54) SIGNAL ISOLATION AND CONVERSION CIRCUIT AND CONTROL APPARATUS

(71) Applicant: SHENZHEN SOSEN ELECTRONICS CO., LTD, Guangdong (CN)

(72) Inventors: Zhiyuan Deng, Guangdong (CN); Chaoyang Zou, Guangdong (CN)

(73) Assignee: SHENZHEN SOSEN ELECTRONICS CO., LTD, Shenzhen (CN)

(*) Notice: Subject to any disclaimer, the term of this patent is extended or adjusted under 35 U.S.C. 154(b) by 9 days.

(21) Appl. No.: 17/289,757

(22) PCT Filed: Mar. 29, 2019

(86) PCT No.: PCT/CN2019/080575
§ 371 (c)(1),
(2) Date: Apr. 29, 2021

(87) PCT Pub. No.: WO2020/118973
PCT Pub. Date: Jun. 18, 2020

(65) Prior Publication Data
US 2021/0399730 A1    Dec. 23, 2021

(30) Foreign Application Priority Data

Dec. 13, 2018 (CN) .................. 201811524378.6

(51) Int. Cl.
*H03K 19/0175* (2006.01)
*H03K 19/14* (2006.01)
*H03K 5/01* (2006.01)

(52) U.S. Cl.
CPC ..... *H03K 19/017572* (2013.01); *H03K 19/14* (2013.01); *H03K 5/01* (2013.01)

(58) Field of Classification Search
CPC ... H03K 19/017572; H03K 19/14; H03K 5/01
(Continued)

(56) References Cited

U.S. PATENT DOCUMENTS

2010/0156505 A1*  6/2010  Strzalkowski ......... H03K 3/012
327/419

FOREIGN PATENT DOCUMENTS

CN      202004745 U      10/2011
CN      202435362 U       9/2012
(Continued)

OTHER PUBLICATIONS

International Search Report of PCT Patent Application No. PCT/CN2019/080575 dated Jul. 29, 2019.

*Primary Examiner* — Tomi Skibinski

(57) ABSTRACT

The invention relates to a signal isolation and conversion circuit and a control apparatus. The signal isolation and conversion circuit comprises a pulse signal generating circuit and an optical coupling complementary isolation circuit connected with the pulse signal generating circuit; the pulse signal generating circuit is used for receiving an input signal and converting the input signal into a pulse signal; the optical coupling complementary isolation circuit comprises at least two photocouplers, and the at least two photocouplers are switched on or off according to the pulse signal so as to transmit the pulse signal to the output end of the signal isolation and conversion circuit. By arranging the optical coupling complementary isolation circuit, the problems of transmission delay, transmission signal distortion and light attenuation and temperature drift of the light-emitting diode in the optocoupler are effectively solved, the timeliness of isolation signal transmission is improved.

16 Claims, 3 Drawing Sheets

(58) Field of Classification Search
USPC .................................................. 327/108–112
See application file for complete search history.

(56) References Cited

FOREIGN PATENT DOCUMENTS

| | | |
|---|---|---|
| CN | 107482925 A | 12/2017 |
| CN | 108923780 A | 11/2018 |

* cited by examiner

SIGNAL ISOLATION AND CONVERSION CIRCUIT AND CONTROL APPARATUS

BACKGROUND OF THE INVENTION

1. Technical Field

The invention relates to the technical field of signal transmission, in particular to a signal isolation and conversion circuit and a control apparatus.

2. Description of Related Art

In order to meet the requirements of safety and reliability, in the dangerous or high anti-interference occasions, the isolation and conversion circuit is generally required, the isolation circuit generally uses magnetic isolation and optical isolation, and the control method is PWM control mode (pulse width duty ratio modulation mode) and PFM (pulse frequency modulation mode).

Magnetic isolation has high requirements for miniaturization and standard packaging process and circuit control mode, and it is also expensive, so optical isolation technology is generally used in low-cost design.

Optical isolation technology is generally used, which is divided into low-speed optocoupler and high-speed optocoupler. The optocoupler is easy to achieve miniaturization and standard packaging process, and the process is mature and cheap. However, when the transmission speed of the high-speed optocoupler used reaches 1 MHz (megahertz), the price is more than ten times that of the ordinary optocoupler (such as PC817), and the cost is higher. When a low-speed optocoupler transmits a PWM pulse width signal, the output end of the optocoupler is a photosensitive triode, and a turn-off trailing current exists, so that the driving pulse width of the light-emitting diode at the receiving end is smaller than the output pulse width of the light-emitting diode at the output end, and data transmission distortion is caused; simultaneously, that low-speed optocoupler has the problem that the light-emitting diode at the receive end has light attenuation due to aging in the use process, and is not suitable for being used in products with ultra-long service life; In addition, There is also the problem of temperature drift of data transmitted by a single optocoupler.

BRIEF SUMMARY OF THE INVENTION

The technical problem to be solved by the invention is to provide a signal isolation and conversion circuit and a control apparatus aiming at the defects of the prior art.

The technical scheme adopted by the invention to solve the technical problem is as follows: the signal isolation and conversion circuit comprises a pulse signal generating circuit and an optical coupling complementary isolation circuit connected with the pulse signal generating circuit;

The pulse signal generating circuit is used for receiving an input signal and converting the input signal into a pulse signal;

The optical coupling complementary isolation circuit comprises at least two photocouplers, and the at least two photocouplers are turned on or turned off according to the pulse signal so as to transmit the pulse signal to the output end of the signal isolation and conversion circuit.

Optionally, the pulse signal generating circuit comprises a control chip, an input end of the control chip receives the input signal, and an output end of the control chip is connected with an input end of the optical coupling complementary isolation circuit.

Optionally, the optical coupling complementary isolation circuit comprises a first photoelectric coupling unit, a second photoelectric coupling unit, a first current limiting circuit, a second current limiting circuit, a first voltage dividing circuit and a second voltage dividing circuit;

A first end of the first current limiting circuit is connected with a power supply voltage, and a second end of the first current limiting circuit is connected with a receiving end of the first photoelectric coupling unit; A receiving end of the first photoelectric coupling unit and a receiving end of the second photoelectric coupling unit are connected with an output end of the pulse signal generating circuit, an output end of the first photoelectric coupling units is connected with a power supply voltage and a first end of a first voltage dividing circuit, and a second end of the first voltage dividing circuit is grounded; A first end of the second voltage dividing circuit is connected with a power supply voltage, and a second end of the second voltage dividing circuit is connected with an output end of the second photoelectric coupling unit and also connected to the ground; The third end of the first voltage dividing circuit and the third end of the second voltage dividing circuit are output ends of the optical coupling complementary isolation circuit;

Wherein the output end of the optical coupling complementary isolation circuit is the output end of the signal isolation and conversion circuit.

Optionally, it also comprises:

A pulse width shaping circuit which connected with the output end of the optical coupling complementary isolation circuit and used for shaping the pulse signal output by the optical coupling complementary isolation circuit and outputting a standard pulse signal.

Optionally, the pulse width shaping circuit comprises a first shaping switch and a second shaping switch;

A first end of the first shaping switch and a first end of the second shaping switch are connected with an output end of the optical coupling complementary isolation circuit, a second end of the first shaping switch is connected with a power supply voltage, and a third end of the first shaping switch and a second end of the second shaping switch are used as output ends of the signal isolation and conversion circuit to output the standard pulse signal; And the third end of the second shaping switch is grounded.

Optionally, both the first shaping switch and the second shaping switch are field effect transistors, and the first shaping switch and the second shaping switch are complementary switches.

Optionally, it also comprises:

A filter circuit connected to the output end of the optical coupling complementary isolation circuit and used for filtering the pulse signal and converting the pulse signal into a DC signal.

Optionally, it also comprises:

An output end connected with the output end of the optical coupling complementary isolation circuit and used for outputting the pulse signal.

Optionally, it also comprises:

A detection circuit arranged at the input end of the pulse signal generating circuit and used for detecting the input signal and carrying out filtering and noise elimination processing on the input signal.

The invention also provides a signal isolation control apparatus, which comprises the signal isolation and conversion circuit.

By arranging the optical coupling complementary isolation circuit, the signal isolation and conversion circuit effectively solves the problem of transmission delay caused by adopting common optical coupling isolation, improves the timeliness of isolated signal transmission, And the problem of transmission signal distortion caused by the fact that the drive pulse width of the receiving end of the optical coupler is smaller than the drive pulse width of the output end of the optical coupler does not exist, And the problems of light attenuation and temperature drift of the light emitting diode in the photoelectric coupler are solved. In addition, the invention can also reduce the cost of isolation transmission by adopting the optical coupling complementary isolation circuit.

BRIEF DESCRIPTION OF THE SEVERAL VIEWS OF THE DRAWINGS

Brief description of that drawing the invention will now be further described by way of example with reference to the accompany drawings in which: Brief description of the drawings.

DETAILED DESCRIPTION OF THE INVENTION

Embodiments of the present invention will now be described more clearly and fully with reference to the accompanying drawings of the embodiments of the present invention. It is to be understood that the described embodiments are only some of the embodiments of this invention and not all of them. Based on the embodiments of the present invention, all other embodiments obtained by those of ordinary skill in the art without creative work belong to the scope of protection of the present invention.

The signal isolation and conversion circuit provided by the invention can be applied to a driving power supply, such as an LED driving power supply, and can also be applied to any occasions needing isolation signal transmission, such as dangerous occasions or occasions needing higher anti-interference requirements and the like.

Figure 1:
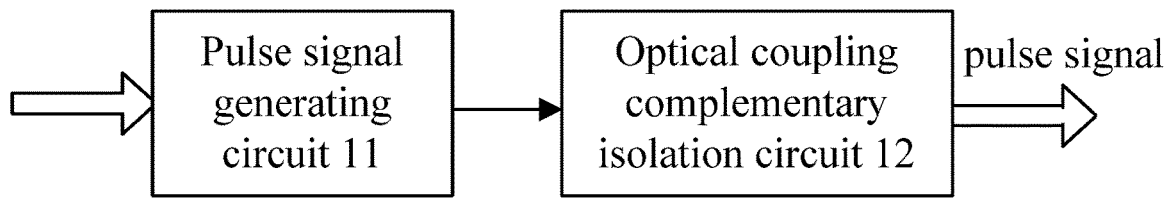
FIG. 1 is a schematic structural diagram of a signal isolation and conversion circuit according to a first embodiment of the present invention.

FIG. 1 is a schematic structural diagram of a signal isolation and conversion circuit according to a first embodiment of the present invention.

As shown in FIG. 1, the signal isolation and conversion circuit of this embodiment may comprise a pulse signal generating circuit 11 and an optical coupling complementary isolation circuit 12 connected to the pulse signal generating circuit 11.

The pulse signal generating circuit 11 receives an input signal (VIN) and converts the input signal (VIN) into a pulse signal; The optical coupling complementary isolation circuit 12 comprises at least two photocouplers, and the at least two photocouplers are turned on or off according to the pulse signal so as to transmit the pulse signal to the output end of the signal isolation and conversion circuit.

Optionally, the pulse signal generating circuit according to the embodiment of the present invention may comprise a control chip, an input end of the control chip receives the input signal (VIN), and an output end of the control chip is connected to an input end of the optical coupling complementary isolation circuit 12. The control chip can convert the received input signal (VIN) into a pulse signal, wherein the pulse signal is a PWM pulse width signal, and the pulse width and the duty cycle thereof are adjusted by the control chip according to the signal transmission requirements.

The optical coupling complementary isolation circuit 12 according to an embodiment of the present invention may comprise a first photoelectric coupling unit, a second photoelectric coupling unit, a first current limiting circuit, a second current limiting circuit, a first voltage dividing circuit and a second voltage dividing circuit.

A first end of the first current limiting circuit is connected with a power supply voltage (VCC), and a second end of the first current limiting circuit is connected with a receiving end of a first photoelectric coupling unit; A receiving end of the first photoelectric coupling unit and a receiving end of the second photoelectric coupling unit are connected with an output end of the pulse signal generating circuit 11, an output end of the first photoelectric coupling units is connected with a power supply signal (5 VA) and a first end of a first voltage dividing circuit, And the second end of the first voltage dividing circuit is grounded; A first end of the second voltage dividing circuit is connected with a power supply signal (5 VA), and a second end of the second voltage dividing circuit is connected with the output end of the second photoelectric coupling unit and is connected to the ground; The third end of the first voltage dividing circuit and the third end of the second voltage dividing circuit are output ends of the optical coupling complementary isolation circuit 12; The output end of the optical coupling complementary isolation circuit 12 is the output end of the signal isolation and conversion circuit.

The first photoelectric coupling unit and the second photoelectric coupling unit of the embodiment of the invention form a complementary form.

Optionally, in the embodiment of the present invention, the first photoelectric coupling unit comprises at least one photocoupler. Further, the at least one photocoupler in the first photoelectric coupling unit may be connected in series or in parallel, wherein the at least one photocoupler may be connected in any series or in any parallel.

Optionally, in an embodiment of the present invention, the second photoelectric coupling unit may comprise at least one photocoupler. Further, at least one photocoupler in the second photoelectric coupling unit may be connected in series or in parallel, wherein the at least one photocoupler may be connected in any series or in any parallel.

Further, in the embodiment of the present invention, the photocouplers used in the first photoelectric coupling unit and the second photoelectric coupling unit may be the same photocouplers.

In the embodiment of the invention, the first current limiting circuit can be realized by resistors, and the number of the adopted resistors is determined according to actual circuit design requirements, wherein a plurality of resistors can be connected in series or in parallel.

In the embodiment of the invention, the second current limiting circuit can be realized by resistors, and the number of the adopted resistors is determined according to actual circuit design requirements, wherein a plurality of resistors can be connected in series or in parallel.

In the embodiment of the invention, the first voltage dividing circuit can be realized by resistors, and the number of the adopted resistors is determined according to actual circuit design requirements, wherein a plurality of resistors can be connected in series or in parallel.

In the embodiment of the invention, the second voltage dividing circuit can be realized by resistors, and the number of the adopted resistors is determined according to actual circuit design requirements, wherein a plurality of resistors can be connected in series or in parallel.

The specific working principle is as follows: the first photoelectric coupling unit and the second photoelectric coupling unit are turned on or turned off according to the pulse signal output by the pulse signal generating circuit 11, wherein when the first photoelectric coupling unit is turned on, the second photoelectric coupling unit is turned off; Or when the first photoelectric coupling unit is turned off, the second photoelectric coupling unit is turned on. In one embodiment, the power supply voltage (VCC) passes through the first current limiting circuit, the first photoelectric coupling unit and the first voltage dividing circuit, and is divided by the first voltage dividing circuit to output a pulse signal when the first photoelectric coupling unit is turned on, and in the process, the second photoelectric coupling unit is turned off, and no signal flow through the second current limiting circuit, the second photoelectric coupling unit and the second voltage dividing circuit; Conversely, when the second photoelectric coupling unit is turned on, the power supply voltage (VCC) through the second current limiting circuit, the second photoelectric coupling unit and the second voltage dividing circuit, the second voltage dividing circuit outputs a pulse signal after voltage division, and in the process, the first photoelectric coupling unit is turned off, and no signal flows through the first current limiting circuit, the first photoelectric coupling unit and the first voltage dividing circuit.

Figure 2:
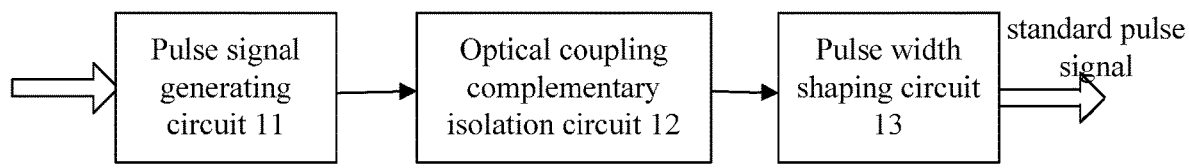
FIG. 2 is a schematic structural diagram of a signal isolation and conversion circuit according to a second embodiment of the present invention.

FIG. 2 is a schematic structural diagram of a signal isolation and conversion circuit according to a second embodiment of the present invention.

As shown in FIG. 2, on the basis of the first embodiment, this embodiment further comprises a pulse width shaping circuit 13 connected to the output end of the optical coupling complementary isolation circuit 12 and used for shaping the pulse signal output by the optical coupling complementary isolation circuit 12 and outputting a standard pulse signal.

Optionally, the pulse width shaping circuit 13 of the embodiment of the present invention comprises a first shaping switch and a second shaping switch; a first end of the first shaping switch and a first end of the second shaping switch are connected with an output end of an optical coupling complementary isolation circuit 12, a second end of the first shaping switch is connected with a power supply signal (5 VA), a third end of the first shaping switch and a second end of the second shaping switch are used as output ends of the signal isolation and conversion circuit to output a standard pulse signal, and a third end of the second shaping switch is grounded.

Further, both the first shaping switch and the second shaping switch of the embodiment of the present invention are field effect transistors, and the first shaping switch and the second shaping switch are complementary switches. Namely the polarity of the field effect transistor adopted by the first shaping switch and the polarity of the field effect transistor adopted by the second shaping switch are opposite.

In the embodiment of the invention, because the output ends of the photocouplers in the first photoelectric coupling unit and the second photoelectric coupling unit are photosensitive transistors, and the falling edge or the rising edge of the photosensitive transistors has a slope when being turned on or turned off, the pulse signal output by the optical coupling complementary isolation circuit 12 is a trapezoidal pulse signal, the pulse width shaping circuit 13 is arranged at the output end of the optical coupling complementary isolation circuit 12 to shape the pulse signal output by the optical coupling complementary isolation circuit 12, so as to shape the trapezoidal pulse signal into a standard steep rising or falling pulse signal, namely a standard pulse signal.

Figure 3:
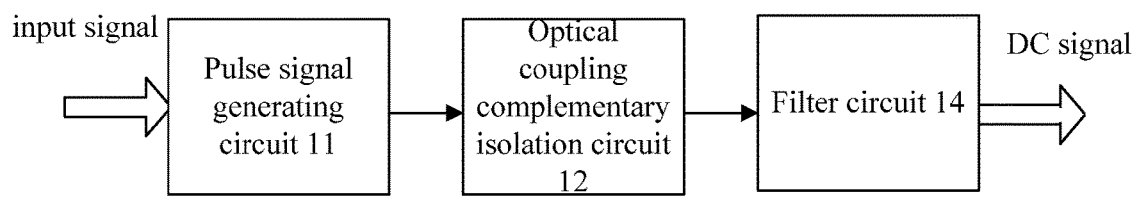
FIG. 3 is a schematic structural diagram of a signal isolation and conversion circuit according to a third embodiment of the present invention.

FIG. 3 is a schematic structural diagram of a signal isolation and conversion circuit according to a third embodiment of the present invention.

As shown in FIG. 3, on the basis of the first embodiment, this embodiment further comprises a filter circuit 14 connected to the output end of the optical coupling complementary isolation circuit 12 and used for filtering the pulse signal and converting the pulse signal into a DC signal.

The output end of the optical coupling complementary isolation circuit 12 can convert the alternating current pulse signal into a DC signal.

Alternatively, the filter circuit 14 of the embodiment of the present invention may be any type of filter circuit 14.

Figure 4:
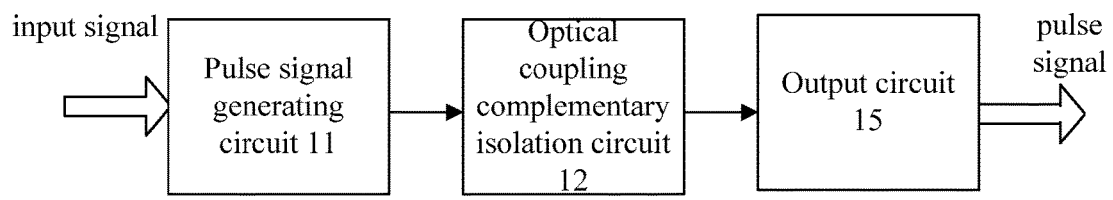
FIG. 4 is a schematic structural diagram of a signal isolation and conversion circuit according to a fourth embodiment of the present invention.

FIG. 4 is a schematic structural diagram of a signal isolation and conversion circuit according to a fourth embodiment of the present invention.

As shown in FIG. 4, on the basis of the first embodiment, this embodiment further comprises an output end connected to the output end of the optical coupling complementary isolation circuit 12 and used for outputting a pulse signal. Optionally, the output circuit 15 of the embodiment of the present invention can be realized by a series resistor or a parallel resistor, and the number of series circuits or the number of parallel resistors adopted is determined according to actual circuit design requirements.

Figure 5:
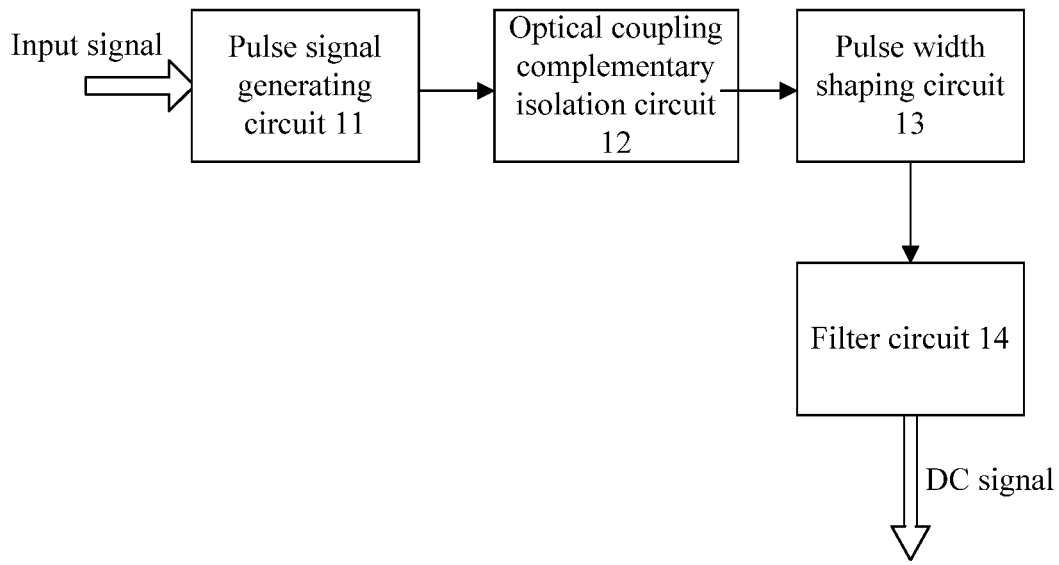
FIG. 5 is a schematic structural diagram of a signal isolation and conversion circuit according to a fifth embodiment of the present invention.

FIG. 5 is a schematic structural diagram of a signal isolation and conversion circuit according to a fifth embodiment of the present invention.

As shown in FIG. 5, on the basis of the second embodiment, this embodiment further comprises a filter circuit 14, the filter circuit 14 is connected to the output end of the pulse width shaping circuit 13 and is used for filtering the standard pulse signal output by the pulse width shaping circuit 13 and converting the standard pulse signal into a DC signal.

Figure 6:
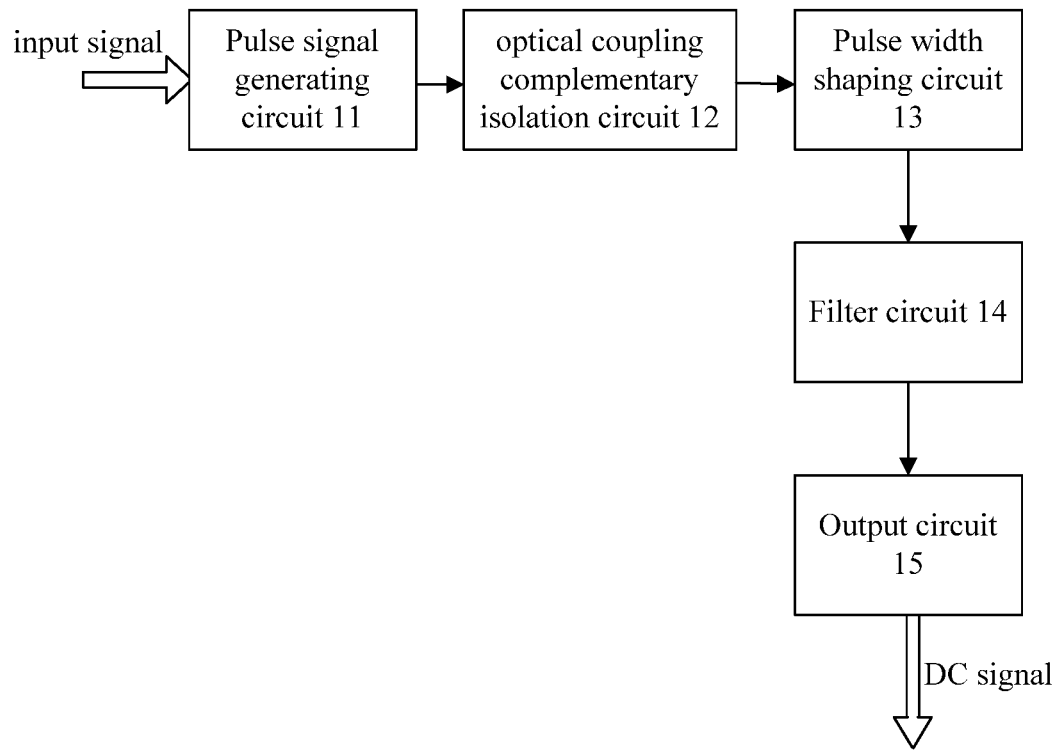
FIG. 6 is a schematic structural diagram of a signal isolation and conversion circuit according to a sixth embodiment of the present invention.

FIG. 6 is a schematic structural diagram of a signal isolation and conversion circuit according to a sixth embodiment of the present invention.

As shown in FIG. 6, on the basis of the fifth embodiment, this embodiment further comprises an output circuit 15; the output circuit 15 is connected to the output end of the filter circuit 14, and outputs the DC signal output by the filter circuit 14 for a subsequent circuit.

Figure 7:
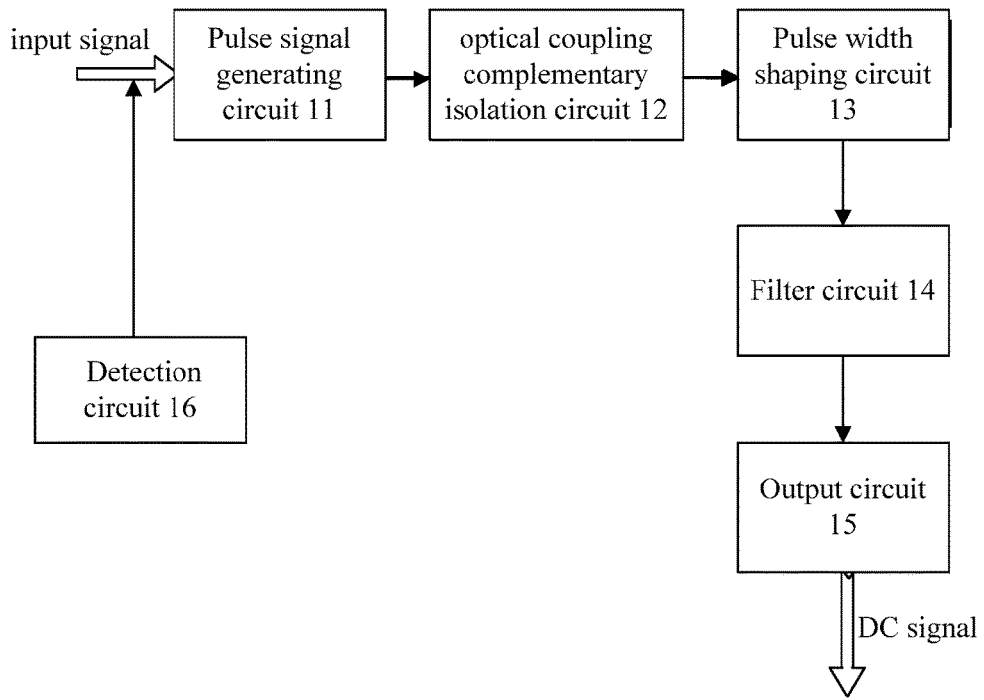
FIG. 7 is a schematic structural diagram of a signal isolation and conversion circuit according to a seventh embodiment of the present invention.

FIG. 7 is a schematic structural diagram of a signal isolation and conversion circuit according to a seventh embodiment of the present invention.

As shown in FIG. 7, this embodiment is based on the sixth embodiment, and further comprises a detection circuit 16 disposed at the input end of the pulse signal generating circuit 11 for detecting an input signal (VIN) and performing filtering and noise elimination processing on the input signal (VIN). Optionally, the detection circuit 16 can be implemented by a capacitor, and the input end of the pulse signal generating circuit 11 can be provided with a capacitor to filtering and de-noising the input signal (VIN), so as to improve the stability of the input signal (VIN).

The working principle of the signal isolation and conversion circuit of the present invention is described below with a specific embodiment. Specifically, referring to FIG. 8, FIG. 8 is a circuit schematic diagram of the embodiment of FIG. 7.

Figure 8:
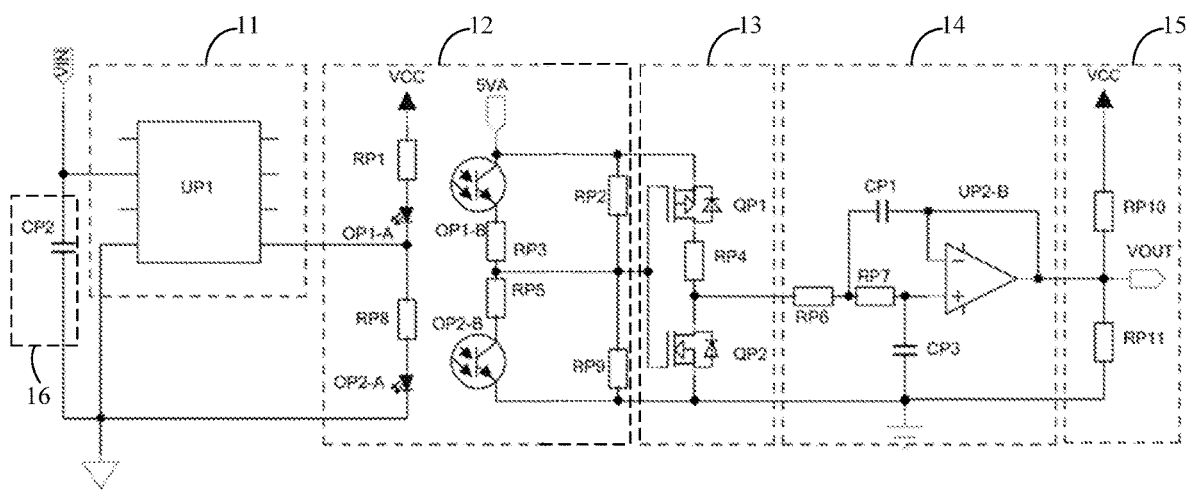
FIG. 8 is a schematic circuit diagram of FIG. 7.

As shown in FIG. 8, in this embodiment, the detection circuit 16 comprises a second capacitor CP2; the pulse signal generating circuit 11 comprises a control chip UP1; the optical coupling complementary isolation circuit 12 comprises a first photoelectric coupling unit, a second photoelectric coupling unit, a first current limiting circuit, a second current limiting circuit, a first voltage dividing circuit and a second voltage dividing circuit. The first photoelectric coupling unit comprises a first photocoupler OP1, the second photoelectric coupling unit comprises a second photocoupler OP2, the first current limiting circuit comprises a first current limiting resistor RP1, the second current limiting circuit comprises an eighth current limiting resistor RP8, the first voltage dividing circuit comprises a third voltage dividing resistor RP3 and a ninth voltage dividing resister RP9, and the second voltage dividing circuit comprises a second voltage dividing resister RP2 and a fifth voltage dividing resistance RP5; The pulse width shaping circuit 13 comprises a first field effect transistor QP1, a second field effect transistor QP2, and a fourth resistor RP4; The filter circuit 14 comprises a sixth resistor RP6, a seventh resistor RP7, a first capacitor CP1, a third capacitor CP3, and an operational amplifier UP2-B; The output circuit 15 comprises a tenth resistor RP10 and an eleventh resistor RP11.

The specific circuit connection is as follows: a first end of the second capacitor CP2 is connected to the input end of the control chip UP1, and a second end of the second capacitor CP2 is grounded.

An output end of the control chip UP1 is connected to a cathode of the light-emitting diode OP1-A of the first photocoupler OP1 and a first end of the eighth current limiting resistor RP8, and an anode of the light-emitting diode OP1-A is connected to a power supply voltage (VCC) through the first current limiting resistor RP1. The second end of the eighth current limiting resistor RP8 is connected to the anode of the light-emitting diode OP2-A of the second photocoupler OP2, and the cathode of the light-emitting diode OP2-A is grounded; The collector of the light-emitting transistor OP1-B of the first photocoupler OP1 is connected to the power supply signal (5 VA), and the emitter of the light-emitting transistor OP1-B (output end of the first photocoupler OP1) is connected to a first end of a third voltage dividing resistor RP3, a second end of the third voltage dividing resistor RP3 is respectively connected with a first end of the first voltage dividing resistor RP5, a first end of a ninth voltage dividing resistor RP9 and a second end of second voltage dividing resistor RP2, the second end of the fifth voltage dividing resistor RP5 is connected to the collector of the light-emitting transistor OP2-B, and the emitter of the light-emitting transistor OP2-B (the output end of the second photocoupler) is grounded together with the second end of a ninth voltage dividing resistor RP9.

The gate of the first field effect transistor QP1 and the gate of the second field effect transistor QP2 are connected with a connection node between the second voltage dividing resistor RP2 and the ninth voltage dividing resistor RP9 and a connection node between the third voltage dividing resistor RP3 and the fifth voltage dividing resistor RP5, and the drain of the first field effect transistor QP1 is connected with a power supply signal (5 VA). The source of the first field effect transistor QP1 is connected to the first end of the fourth resistor RP4, the second end of the fourth resistor RP4 is connected to the source of the second field effect transistor QP2, and the drain of the second field effect transistor QP2 is grounded.

The second end of the fourth resistor RP4 and the source electrode of the second field effect transistor QP2 are also connected with the first end of a sixth resistor RP6, the second end of the sixth resistor RP6 is respectively connected with the first end of a seventh resistor P7 and the first end of the first capacitor CP1, the second end of the seventh resistor P7 is connected with a positive input terminal of the operational amplifier UP2-B, And is also ground through a third capacitor CP3; The second end of the first capacitor CP1 is connected to the negative input end and the output end of the operational amplifier UP2-B, respectively. The output end of the operational amplifier UP2-B is connected to the second end of a tenth resistor RP10 and the first end of an eleventh resistor RP11. The first end of a tenth resistor RP10 is connected to a power supply voltage (VCC). And the second end of the eleventh resistor RP11 is grounded.

The connection between the output end of the operational amplifier UP2-B and the second end of the tenth resistor RP10 and the first end of the eleventh resistor RP11 is the output end (VOUT) of the signal isolation conversion circuit.

As shown in FIG. 8, the specific working principle of the signal isolation and conversion circuit of this embodiment is as follows:

The input signal (VIN) is filtered by the second capacitor CP2 and then is connected to the input end of the control chip UP1, and the control chip UP1 converts the input signal (VIN) into a pulse signal, wherein the drive output end of the control chips UP1 is push-pull drive. When the output end of the control chip UP1 is at a high level, the pulse signal is current-limited by the eighth current limiting resistor RP8, and is connected to the second photocoupler OP2, so that the second photocoupler OP2 is turned on, and the first photocoupler OP1 is turned off. On the contrary, when the output end of the control chip UP1 is at a low level, the pulse signal is current-limited by the first current limiting resistor RP1 and is connected to the first photocoupler OP1, so that the first photocoupler OP1 is turned on and the second photocoupler OP2 is turned off, so that the first photocoupler OP1 and the second photocoupler OP2 are turned on complementarily.

When the first photocoupler OP1 is turned on and the second photocoupler OP2 is turned off, the power supply voltage (VCC) is applied to the gate of the second field effect transistor QP2 through the first photocoupler OP1, the third voltage dividing resistor RP3 and the ninth voltage dividing resistor RP9, so that the second field effect transistor QP2 is turned on to output a low level, and a pulse width conversion is completed.

When the second photocoupler OP2 is turned on and the first photocoupler OP1 is turned off, the power supply voltage (VCC) is applied to the gate of the first field effect transistor QP1 through the second photocoupler OP2, the second voltage dividing resistor RP2 and the fifth voltage dividing resistor RP5, so that the first field effect transistor is turned on and outputs a high level to complete another pulse width conversion.

The ramp pulse signals output from the first photocoupler OP1 and the second photocoupler OP2 are converted into standard steep falling or rising standard pulse signals through the first field effect transistor QP1 and the second field effect transistor QP2.

A filter circuit 14 including a sixth resistor RP6, a seventh resistor RP7, a first capacitor CP1, a third capacitor CP3, and an operational amplifier UP2-B converts the standard pulse signal into a DC signal. It is to be understood that the filter circuit 14 of the embodiment of the present invention is not limited to this, and any filter circuit 14 having a filter processing function is applicable.

An output circuit 15 composed of a tenth resistor R10 and an eleventh resistor R11 outputs a DC signal.

In this embodiment, since that characteristic of the first photocoupler OP1 and the second photocoupler OP2 are the same, the first photocoupler OP1 and the second photocoupler OP2 are in a complementary on mode, and the transmission delay of one photocoupler is use to compensate the delay of the other photocoupler, And that problem that the drive pulse width of the light-emitting diode at the receiving end of the photocoupler is smaller than the output pulse width at the output end of the photocoupler is solved. In addition, since the peripheral parameters of the first photocoupler OP1 and the second photocoupler OP2 are consistent with the internal parameters, the light attenuation intensities of the light emitting diodes of the two photocouplers are also basically consistent, thereby ensuring the consistency of the performance of the photocouplers in long-life products. Further, due to the first photocoupler OP1 and the second photocoupler OP2, the temperature drifts of the two photocouplers are basically the same, and a complementary control form is adopted, so that the problem of temperature drift of a single optocouple is effectively solved, the performance of a common photocoupler is greatly improved, and the cost of isolation conversion is reduced.

The invention also provides a signal isolation control apparatus which comprises the signal isolation and conversion circuit. Optionally, the signal isolation control apparatus provided by the embodiment of the invention can be integrated into an integrated control unit so as to be widely applied to related signal isolation transmission fields, for example, the signal isolation control apparatus can be applied to a single chip isolation dimming control circuit and the like.

The above embodiments are only for illustrating the technical concepts and feature of the present invention, and are intended to enable those skilled in the art to understand and implement the present invention, but not to limit the scope of protection of the present invention. All equivalent change and modifications that come within that scope of the append claims are intended to be embraced therein.

It should be understood that modifications and variations can be made by those skilled in the art in light of the above description, and all such modifications and variations are intended to be within the scope of the appended claims.

What is claimed is:

1. A signal isolation and conversion circuit, comprising: a pulse signal generating circuit, and an optical coupling complementary isolation circuit connected to the pulse signal generating circuit;
the pulse signal generating circuit is used for receiving an input signal and converting the input signal into a pulse signal;
the optical coupling complementary isolation circuit comprises at least two photocouplers, and the at least two photocouplers are turned on or turned off according to the pulse signal so as to transmit the pulse signal to the output end of the signal isolation conversion circuit;
the optical coupling complementary isolation circuit comprises a first photoelectric coupling unit, a second photoelectric coupling unit, a first current limiting circuit, a second current limiting circuit, a first voltage dividing circuit and a second voltage dividing circuit;
a first end of the first current limiting circuit is connected with a power supply voltage, and a second end of the first current limiting circuit is connected with a receiving end of the first photoelectric coupling unit a receiving end of the first photoelectric coupling unit and a receiving end of the second photoelectric coupling unit are connected with an output end of the pulse signal generating circuit, an output end of each of the first photoelectric coupling units is respectively connected with a power supply voltage and a first end of a first voltage dividing circuit, and a second end of each of the first voltage dividing circuits is grounded; a first end of the second voltage dividing circuit is connected with a power supply voltage, and a second end of the second voltage dividing circuit is connected with an output end of the second photoelectric coupling unit and is connected to the ground; the third end of the first voltage dividing circuit and the third end of the second voltage dividing circuit are output ends of the optical coupling complementary isolation circuit;
wherein the output end of the optical coupling complementary isolation circuit is the output end of the signal isolation conversion circuit.

2. The signal isolation and conversion circuit according to claim 1, wherein the pulse signal generating circuit comprises a control chip, an input end of the control chip receives the input signal, and an output end of the control chip is connected to an input end of the optical coupling complementary isolation circuit.

3. The signal isolation conversion circuit according to claim 1, further comprising:
a pulse width shaping circuit which is connected with the output end of the optical coupling complementary isolation circuit and used for shaping the pulse signal output by the optical coupling complementary isolation circuit and outputting a standard pulse signal.

4. The signal isolation and conversion circuit according to claim 3, wherein the pulse width shaping circuit comprises a first shaping switch and a second shaping switch;
a first end of the first shaping switch and a first end of the second shaping switch are connected with an output end of the optical coupling complementary isolation circuit, a second end of the first shaping switch is connected with a power supply voltage, and a third end thereof and a second end thereof are used as output ends of the signal isolation and conversion circuit to output the standard pulse signal; and the third end of the second shaping switch is grounded.

5. The signal isolation conversion circuit according to claim 4, wherein the first shaping switch and the second shaping switch are field effect transistors, and the first shaping switch and the second shaping switch are complementary switches.

6. The signal isolation conversion circuit of claim 1, further comprising:
a filter circuit which is connected with the output end of the optical coupling complementary isolation circuit and is used for filtering the pulse signal and converting the pulse signal into a direct current signal.

7. The signal isolation conversion circuit of claim 1, further comprising:
an output end connected with the output end of the optical coupling complementary isolation circuit and used for outputting the pulse signal.

8. The signal isolation conversion circuit according to claim 1, further comprising:
a detection circuit arranged at the input end of the pulse signal generating circuit and used for detecting the input signal and carrying out filtering and noise elimination processing on the input signal.

9. A signal isolation control apparatus comprising a signal isolation and conversion circuit, wherein:
the signal isolation and conversion circuit comprising: a pulse signal generating circuit, and an optical coupling complementary isolation circuit connected to the pulse signal generating circuit;
the pulse signal generating circuit is used for receiving an input signal and converting the input signal into a pulse signal;
the optical coupling complementary isolation circuit comprises at least two photocouplers, and the at least two photocouplers are turned on or turned off according to the pulse signal so as to transmit the pulse signal to the output end of the signal isolation conversion circuit;
the optical coupling complementary isolation circuit comprises a first photoelectric coupling unit, a second photoelectric coupling unit, a first current limiting circuit, a second current limiting circuit, a first voltage dividing circuit and a second voltage dividing circuit;
a first end of the first current limiting circuit is connected with a power supply voltage, and a second end of the first current limiting circuit is connected with a receiving end of the first photoelectric coupling unit a receiving end of the first photoelectric coupling unit and a receiving end of the second photoelectric coupling unit are connected with an output end of the pulse signal generating circuit, an output end of each of the first photoelectric coupling units is respectively connected with a power supply voltage and a first end of a first voltage dividing circuit, and a second end of each of the first voltage dividing circuits is grounded; a first end of the second voltage dividing circuit is connected with a power supply voltage, and a second end of the second voltage dividing circuit is connected with an output end of the second photoelectric coupling unit and is connected to the ground; the third end of the first voltage dividing circuit and the third end of the second voltage dividing circuit are output ends of the optical coupling complementary isolation circuit;
wherein the output end of the optical coupling complementary isolation circuit is the output end of the signal isolation conversion circuit.

10. The signal isolation control apparatus according to claim 9, wherein the pulse signal generating circuit comprises a control chip, an input end of the control chip receives the input signal, and an output end of the control chip is connected to an input end of the optical coupling complementary isolation circuit.

11. The signal isolation control apparatus according to claim 9, further comprising:
a pulse width shaping circuit which is connected with the output end of the optical coupling complementary isolation circuit and used for shaping the pulse signal output by the optical coupling complementary isolation circuit and outputting a standard pulse signal.

12. The signal isolation control apparatus according to claim 11, wherein the pulse width shaping circuit comprises a first shaping switch and a second shaping switch;
a first end of the first shaping switch and a first end of the second shaping switch are connected with an output end of the optical coupling complementary isolation circuit, a second end of the first shaping switch is connected with a power supply voltage, and a third end thereof and a second end thereof are used as output ends of the signal isolation and conversion circuit to output the standard pulse signal; and the third end of the second shaping switch is grounded.

13. The signal isolation control apparatus according to claim 12, wherein the first shaping switch and the second shaping switch are field effect transistors, and the first shaping switch and the second shaping switch are complementary switches.

14. The signal isolation control apparatus according to claim 9, further comprising:
a filter circuit which is connected with the output end of the optical coupling complementary isolation circuit and is used for filtering the pulse signal and converting the pulse signal into a direct current signal.

15. The signal isolation control apparatus according to claim 9, further comprising:
an output end connected with the output end of the optical coupling complementary isolation circuit and used for outputting the pulse signal.

16. The signal isolation control apparatus according to claim 9, further comprising:
a detection circuit is arranged at the input end of the pulse signal generating circuit and is used for detecting the input signal and carrying out filtering and noise elimination processing on the input signal.

* * * * *